(12) United States Patent
Yang

(10) Patent No.: US 6,459,241 B1
(45) Date of Patent: Oct. 1, 2002

(54) CAPACITY DETECTION METHODOLOGY AND CIRCUITRY BY BOOSTED TRANSIENT CURRENT

(76) Inventor: Tai-Her Yang, No. 59, Chung Hsing 8 St., Si-Hu Town, Dzan-Hwa (TW)

( * ) Notice: Subject to any disclaimer, the term of this patent is extended or adjusted under 35 U.S.C. 154(b) by 0 days.

(21) Appl. No.: 09/908,570

(22) Filed: Jul. 20, 2001

(51) Int. Cl.⁷ .................................................. H02J 7/00
(52) U.S. Cl. ........................................ 320/132; 320/130
(58) Field of Search ................................ 320/132, 130, 320/137, 165, 166, 117

(56) References Cited

U.S. PATENT DOCUMENTS 4,538,074 A  *  8/1985  Fraden ........................ 307/126

\* cited by examiner

Primary Examiner—Edward H. Tso
Assistant Examiner—Lawrence Luk
(74) Attorney, Agent, or Firm—Bacon & Thomas

(57) ABSTRACT

A methodology and circuitry for detecting capacity by boosted transient current having a load comprised of a bilateral capacitor and a limiting current impedance connected in series, the bilateral capacitor is charged first and then arranged in serials in reverse with the limiting current impedance and connected at both terminals of a battery to generate a boosted transient current for measuring and constructing the battery capacity.

4 Claims, 2 Drawing Sheets

CAPACITY DETECTION METHODOLOGY AND CIRCUITRY BY BOOSTED TRANSIENT CURRENT

BACKGROUND OF THE INVENTION (a) Field of the Invention

The present invention relates to a methodology and circuitry for detecting a battery capacity by boosted transient current; and more particularly, to one having a transient load comprised of a bilateral capacitor and a limiting current impedance connected in series at both terminals of a battery.

(b) Description of the Prior Art

Traditionally, additional to an electrolytic meter, internal resistance of a battery can be also used to measure battery capacity. However, an ammeter with low resistance and large current is usually required to be directly connected in series to create a shortage on both forward and reverse terminals at the output of the battery while measuring the battery capacity with the internal resistance method. As a result, significant risks present including severe sparking, fast temperature rising on the battery and conductor, and large power consumption that demand the measurement can only be done by a well-trained professional.

SUMMARY OF THE INVENTION

The primary purpose of the present invention is to provide a methodology and circuitry for detecting capacity by boosted transient current. To achieve the purpose, load comprised of a bilateral capacitor and a limiting current impedance connected in series. Within, the bilateral capacitor is charged first and then arranged in serials in reverse with the limiting current impedance and is connected at both terminals of a battery to generate a boosted transient current for measuring and constructing the battery capacity.

DETAILED DESCRIPTION OF THE PREFERRED EMBODIMENTS

Traditionally, additional to an electrolytic meter, internal resistance of a battery can be also used to measure battery capacity. However, an ammeter with low resistance and large current is usually required to be directly connected in series to create a shortage on both forward and reverse terminals at the output of the battery while measuring the battery capacity with the internal resistance method. As a result, significant risks present including severe sparking, fast temperature rising on the battery and conductor, and large power consumption that demand the measurement can only be done by a well-trained professional. In the present invention, a load comprised of a bilateral capacitor and a limiting current impedance connected in series. Within, the bilateral capacitor is charged first and then arranged in serials in reverse with the limiting current impedance and is connected at both terminals of a battery to generate a boosted transient current for measuring and constructing the battery capacity.

Figure 1:
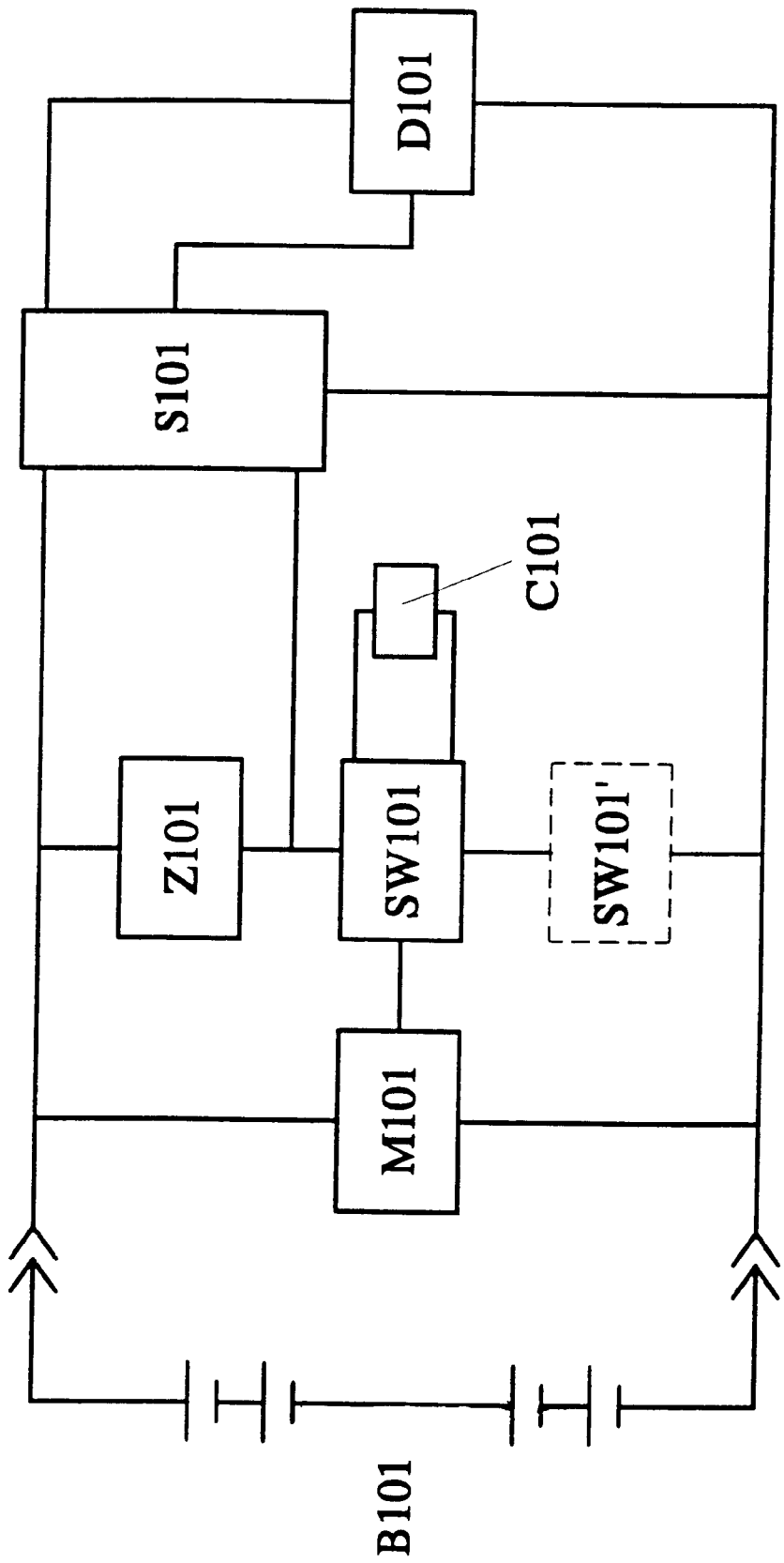
FIG. 1 is a block chart showing a circuit of a preferred embodiment of the present invention.

Referring to FIG. 1, a preferred embodiment of a circuit of the present invention is essentially comprised of a battery B101, a switch SW101, a limiting current impedance Z101, a manipulator M101, a detection circuit S101 and a display circuit D101:

1. Said battery B101 relates to the battery pending measurement;
2. Said switch SW101 is comprised of one or more than one solid-state or mechanic-electronic switch. The purpose of the switch SW101 is to switch between both polarities of charging and discharging by the bilateral capacitor, and on & off between the battery and a. load comprised of the bilateral capacitor C101 and the limiting current impedance Z101 connected in series with it for sampling measurement;
3. Said limiting current impedance Z101 is either comprised of a resistive, a induced impedance, or a mix of both;
4. Said bilateral capacitor C101 is a bipolar capacitor or its equivalent circuit that allows bipolar charging and discharging. Switching between forward and reverse polarities for charging and discharging by the bilateral capacitor C101, and timing and frequency to take sample between the battery and the limiting current impedance connected in series to the bilateral capacitor C101 are controlled by the switch SW101. Alternatively, the bilateral capacitor C101 may be subject to a separately provided switch SW101 for sampling timing and frequency control;
5. Said manipulator M101 relates to a mechanic-electronic or solid-state circuit to operate the switch SW101 or SW101', further to control polarities switching of charging and discharging by the bilateral capacitor C101 and the sampling timing and frequency between the battery and the limiting current impedance connected in series to the bilateral capacitor C101. On and off operation of the manipulator M101 may be controlled either by manual or by electric signal;
6. Said detection circuit S101 relates to a mechanic-electronic or solid-state circuit device, is capable of directly detecting a transient drop from the transient limiting current impedance Z101 of inverse drop transient load, or when subject to control by the manipulator M101 for deciding the sampling timing, frequency and density. Furthermore, the detection circuit is capable of directly converting sampling signals into corresponding analog or digital signals to be sent to the display circuit D101 with or without interpolation; and
7. Said display circuit D101 relates to digital, analog or multi-level display depending on signals from the circuit. measured.

Figure 2:
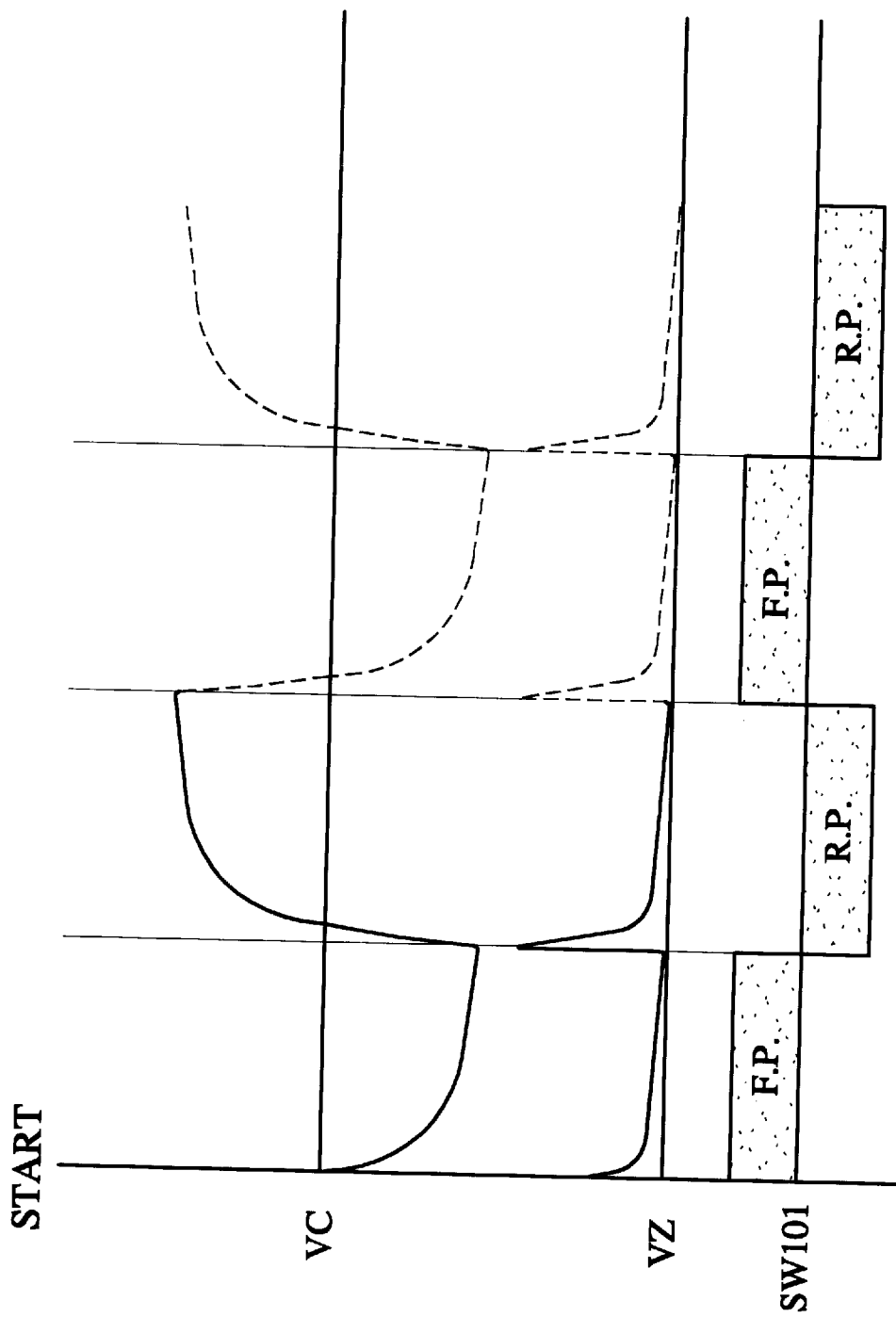
FIG. 2 is a view showing operation characteristics of the present invention.

Now referring to FIG. 2 for a preferred embodiment of the present invention, a boosted transient current is used to measure capacity of the battery. Wherein, upon power up, the battery B101 to be measured is connected with its forward polarity (FP) in parallel to the circuitry of the present invention. When the manipulator M101 gives a measurement command to the switch SW101, the battery starts to charge the bilateral capacitor C101. During a voltage VC of the bilateral capacitor C101 reaches its setting or pre-set time, the bilateral capacitor C101 indicates reverse polarity (RP) and is connected in series to the limiting current impedance Z101 by the operation of the switch SW101. Once the switch SW101 is connected to the battery B101, a transient current of the battery B101 passing through the limiting current impedance Z101 is boosted. Furthermore, the amperage of a transient current for sampling is also boosted as a floating voltage of the battery B101 is eliminated by a voltage indicating reverse polarity from the battery B101. As a result, a limiting current impedance voltage VZ for sampling is formed at both terminals of the limiting current impedance Z101 to improve sampling precision while the sampling voltage VZ of the transient limiting current impedance Z101 is transmitted to the detection circuit S101. Interpolation for compensation may be provided by the detection circuit S101 as required, or sampling signals may be directly converted into corresponding analog or digital signals to be sent to the display circuit D101 for digital, analog or multi-level display.

In the circuitry of the preferred embodiment, the bilateral capacitor C101 functions as a primary charging source required by a primary reverse polarity voltage transient load, or the charging source may be supplied by the battery B101 to be detected or by an independent secondary source.

As disclosed, the present invention provides a transient load with reverse voltage to create a boosted transient current for detection of a battery capacity. Measurement precision is improved as a battery floating voltage is eliminated by a reverse voltage making the present invention a highly reliable and practical design for easy measurement of battery capacity to offer more industrial value than the prior art. Accordingly, the application for a patent is duly filed.

I claim:

1. A methodology to detect capacity by boosted transient current comprised of a transient load comprised of a bilateral capacitor and a limiting current impedance connected in series, the bilateral capacitor is first charged, and then connected in series in reverse with the limiting current impedance at both terminals of a battery to measure said boosted transient current and construct capacity of the battery.

2. A methodology to detect capacity by boosted transient current as claimed in claim 1, wherein, a circuit essentially comprised of a battery, a switch, a limiting current impedance, a bilateral capacitor, a manipulator, a detection circuit and a display circuit characterized by that said battery B101 being a battery to be measured;

said switch SW10 comprised of one or more than one solid-state or mechanical-electronic switching device for switching between both forward and reverse polarities of charging and discharging of the bilateral capacitor C101, and On & Off operation for sampling between the battery and a load comprised of the bilateral capacitor and a limiting current impedance Z101 connected in series;

said limiting current impedance Z101 being of a resistive, or induced impedance or a mix of both;

said bilateral capacitor C101 related to a bipolar capacity device or its equivalent allowing bipolar charging and discharging and subject to control by the switch SW101 or by a separately provided switch SW101' for switching between forward and reverse polarities when the bilateral capacitor C101 is charging or discharging, and for determination of sampling timing and frequency between the limiting current impedance connected in series to it and the battery;

said manipulator M101 related to a mechanic-electronic or solid-state circuit operated either by manual or by electric signals for the switch SW101 in the circuit or the separately provided SW101' to control the switching between charging and discharging polarities, and the sampling timing and frequency between the battery B101 and the limiting current impedance Z101 connected to the bilateral capacitor C101;

said detection circuit S101 related to a mechanic-electronic or solid-state electronic circuit device to be used for direct detection of a transient drop of the limiting current impedance Z101 in reverse voltage transient load, or subject to control by the manipulator M101 in deciding sampling timing, frequency and density, or to directly convert sampling signals into corresponding analog or digital signals with or without interpolation as required to be sent to the display circuit D101; and said display circuit for digital, analog or multi-level display depending on the signals of measuring the circuit.

3. A methodology to detect capacity by boosted transient current as claimed in claim 1, wherein, upon power up, the battery B101 to be measured being connected with its forward polarity (FP) in parallel to the circuitry of the present invention; and the manipulator M101 giving a measurement command to the switch for the battery M101 to start charging the bilateral capacitor C101; while a voltage VC of the bilateral capacitor C101 reaching its setting or pre-set time, the bilateral capacitor C101 indicating reverse polarity (RP) and connected in series to the limiting current impedance Z101 by the operation of the switch SW101; the switch SW10 being connected to the battery B101 to boost, a transient current of the battery passing through the limiting current impedance Z101, and the amperage of a transient current for sampling is also boosted as a floating voltage of the battery B101 being eliminated by a voltage indicating reverse polarity from the battery; a limiting current impedance voltage VZ for sampling being formed at both terminals of the limiting current impedance Z101 to improve sampling precision while the sampling voltage VZ of the transient limiting current impedance Z101 being transmitted to the detection circuit S101; and interpolation for compensation provided by the detection circuit S101 as required, or sampling signals directly converted into corresponding analog or digital signals transmitted to the display circuit D101 for digital, analog or multi-level display.

4. A methodology to detect capacity by boosted transient current as claimed in claim 1, wherein, the bilateral capacitor C101 functions as a primary charging source required by a primary reverse polarity voltage transient load, secondary source may by used as applicable.

* * * * *